US012669646B2

(12) United States Patent
Charbonnier et al.

(10) Patent No.: US 12,669,646 B2
(45) Date of Patent: Jun. 30, 2026

(54) PULSED LASER DEVICE COMPRISING A HYBRID LASER SOURCE WITH ACTIVE OPTICAL TRIGGERING

(71) Applicant: COMMISSARIAT A L'ENERGIE ATOMIQUE ET AUX ENERGIES ALTERNATIVES, Paris (FR)

(72) Inventors: Benoit Charbonnier, Grenoble (FR); Keshia Mekemeza Ona, Grenoble (FR)

(73) Assignee: COMMISSARIAT A L'ENERGIE ATOMIQUE ET AUX ENERGIES ALTERNATIVES, Paris (FR)

( * ) Notice: Subject to any disclaimer, the term of this patent is extended or adjusted under 35 U.S.C. 154(b) by 304 days.

(21) Appl. No.: 18/516,176

(22) Filed: Nov. 21, 2023

(65) Prior Publication Data

US 2024/0168228 A1 May 23, 2024

(30) Foreign Application Priority Data

Nov. 23, 2022 (FR) ...................................... 2212211

(51) Int. Cl.
| | |
|---|---|
| *G06N 3/049* | (2023.01) |
| *G02B 6/122* | (2006.01) |
| *H01S 5/026* | (2006.01) |
| *H01S 5/10* | (2021.01) |
| *G02B 6/12* | (2006.01) |

(52) U.S. Cl.
CPC ........... *G02B 6/1225* (2013.01); *G06N 3/049* (2013.01); *H01S 5/026* (2013.01); *H01S 5/1032* (2013.01); *G02B 2006/12061* (2013.01)

(58) Field of Classification Search
CPC ...................................................... G06N 3/049
See application file for complete search history.

(56) References Cited

U.S. PATENT DOCUMENTS

| | | | | |
|---|---|---|---|---|
| 7,792,170 B2 * | 9/2010 | Horie | .................... | H01S 5/2231 |
| | | | | 372/45.01 |
| 2008/0044128 A1 * | 2/2008 | Kish | .................. | G02B 6/12033 |
| | | | | 385/14 |

OTHER PUBLICATIONS

Buda et al., Low-Loss Low-Confinement GaAs—AlGaAs DQW Laser Diode with Optical Trap Layer for High-Power Operation, IEEE Photonics Technology Letters, vol. 11, No. 2, Feb. 1999 (Year: 1999).*

(Continued)

*Primary Examiner* — Charlie Y Peng
(74) *Attorney, Agent, or Firm* — McDonald Hopkins LLC

(57) ABSTRACT

A pulsed laser device including: a III-V-on-silicon type hybrid pulsed laser source, including a gain section and a saturable absorber section which rest on a photonic substrate, and a longitudinal waveguide located in the photonic substrate; a control optical device including an optical pulse emitter source and a lateral waveguide located in the photonic substrate; the waveguides being sized so that the confinement factor $\Gamma_{Iae/SA}$, $\Gamma_{Iai/G}$ in the quantum wells of the corresponding section of the optical mode of the lateral waveguide is higher than the confinement factor $I_{L/ms}$, in the quantum wells of the semiconductor medium, of the optical mode of the longitudinal waveguide.

15 Claims, 5 Drawing Sheets

(56) References Cited

OTHER PUBLICATIONS

Iordache et al., High power CW output from low confinement asymmetric structure diode laser, Electronics Letters, 35(2), 148-149, 1999 (Year: 1999).*

Mekemeza-Ona Keshia et al: "All optical Q-switched laser based spiking neuron", Frontiers in Physics, vol. 10, Nov. 16, 2022.

Ona Keshia Mekemeza et al: "Design of an 1-15 Integrated III-Von silicon semiconductor laser for spiking neural networks", 2021 IEEE International Interconnect Technology Conference (IITC), IEEE, Jul. 6, 2021, pp. 1-2.

Diamantopoulos Nikolaos-Panteleimon et al: "Ultrafast Spiking Membrane III-V Laser Neuron on Si", 2022 European Conference on Optical Communication (ECOC), Optica, Sep. 18, 2022, pp. 1-4.

Search Report fort French application No. 2212211 dated May 30, 2023.

* cited by examiner

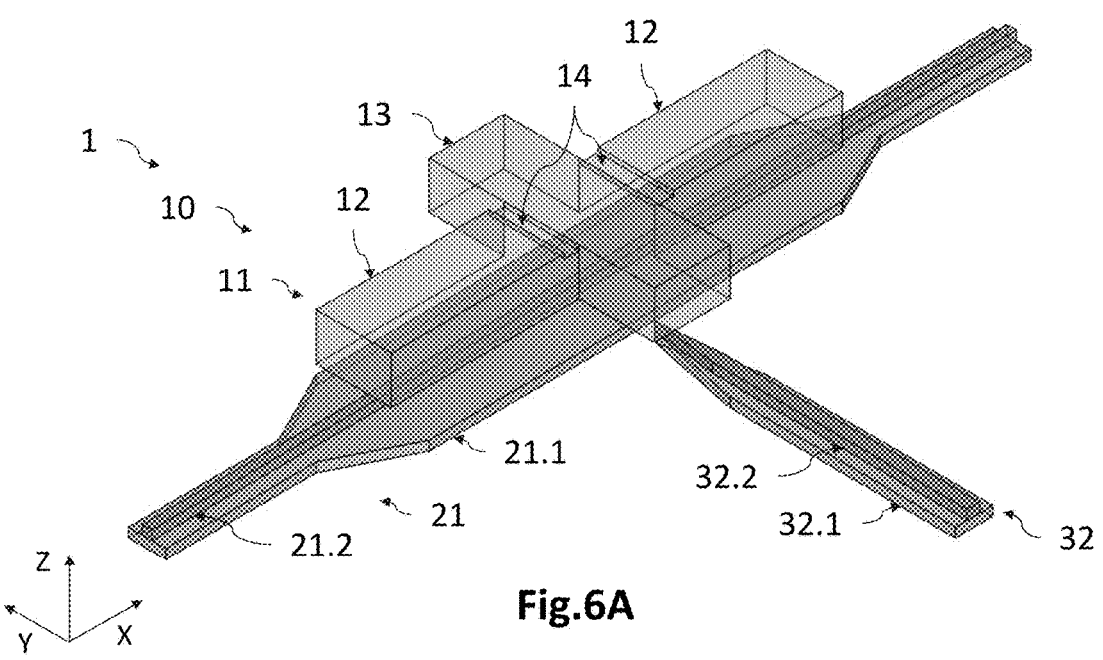
Fig.6A
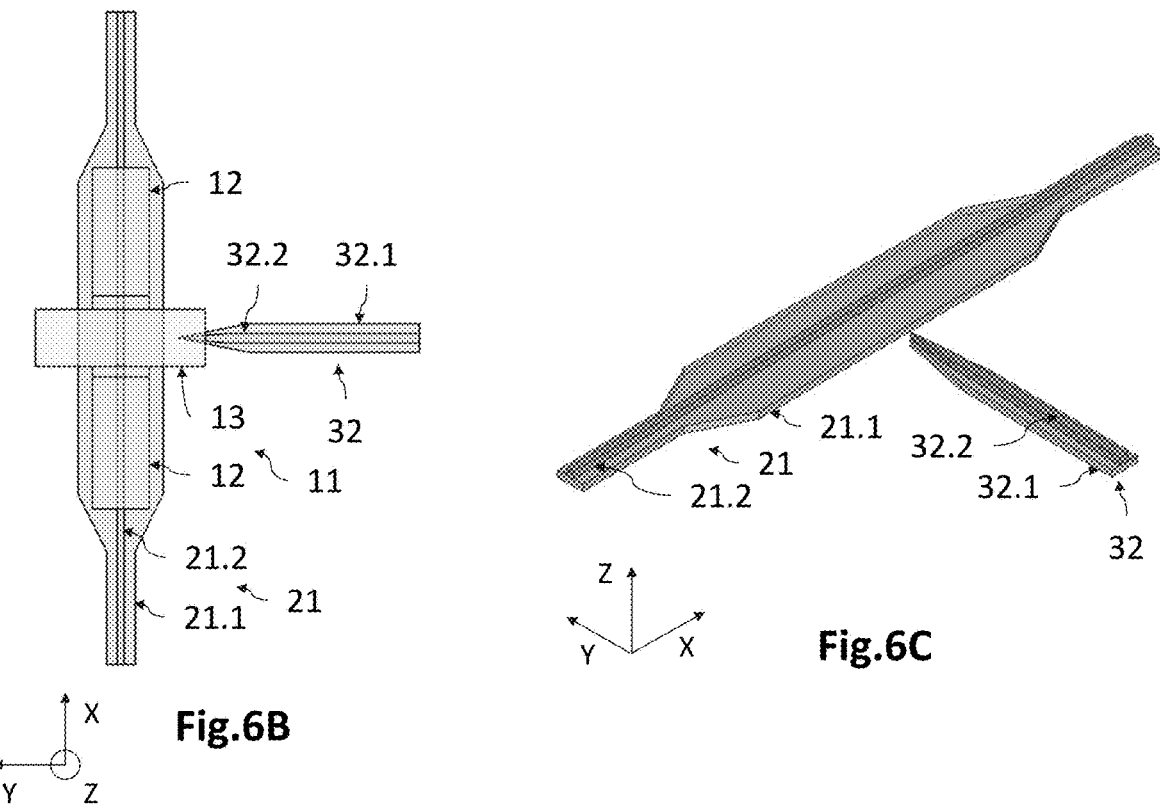
Fig.6B
Fig.6C

PULSED LASER DEVICE COMPRISING A HYBRID LASER SOURCE WITH ACTIVE OPTICAL TRIGGERING

CROSS-REFERENCE TO RELATED APPLICATIONS

This application claims priority from French Patent Application No. 2212211 filed on Nov. 23, 2022. The content of this application is incorporated herein by reference in its entirety.

TECHNICAL FIELD

The field of the invention is that of neuromorphic photonics based on networks of pulsed neurons. More specifically, the invention relates to a pulsed laser device which could form a photonic neuron, and including a pulsed laser source.

PRIOR ART

Neuromorphic computing is a field currently in strong development, in particular to address expectations in terms of intensive data processing. For this purpose, artificial neural networks (ANN) have proved their power and their efficiency. Such artificial neurons may be made based on pulsed laser sources on photonic chips, so that we talk about neuromorphic photonics and spiking photonic neurons.

A general presentation of spiking photonic neurons could be found in particular in the article by Shastri et al. entitled Principles of Neuromorphic Photonics, arXiv:1801.00016, 2018. A spiking photonic neuron may include: a set of input ports, each supplying an input signal $x_i$ with i ranging from 1 to m, each input signal $x_i$ being weighted by a weight $w_i$ with a positive or negative sign; and a combiner performing the sum of the weighted input signals $w_i x_i$, associated with an activation function. The artificial neuron supplies an output signal y when the sum of the weighted input signals exceeds a predefined threshold. In the case of spiking photonic neurons, the output signal is an optical pulse (spike). Following the emission of an optical pulse by the spiking photonic neuron, the latter enters in a so-called refractory period, in which it does not emit any output optical pulses, irrespective of the input signals.

Such spiking photonic neurons may be classified into two categories: a so-called 'all optical' first category in which the input signals remain in the optical field up to the laser source; and a so-called 'optical/electrical/optical' (O/E/O) second category in which the input signals transit from the optical domain into the electrical domain, then return back into the optical domain.

The article by Robertson et al. entitled Ultrafast optical integration and pattern classification for neuromorphic photonics based on spiking VCSEL neurons, Sci Rep. 2020 Apr. 8; 10:6098 describes a spiking photonic neuron of the all optical type. It is formed by a laser source with a vertical cavity emitting by the surface (VCSEL) coupled to an excitation laser source. The excitation optical pulse should have a wavelength shifted with respect to that of the wavelength of the optical cavity of the VCSEL source. In addition, the excitation optical pulses must be reversed, to the extent that it is the abrupt decrease in the incident optical power which could cause the excitation of the neuron formed by the VCSEL source. Hence, the spiking photonic neuron has the drawback of requiring several optoelectronic devices for the reversal of the optical pulses, as well as for the strict control of the difference between the wavelengths.

Moreover, the article by Peng et al. entitled Neuromorphic Photonic Integrated Circuits, IEEE J. Sel. Topics Quantum Electron., vol. 24, no. 6, 2018, describes an O/E/O type spiking photonic neuron. The latter includes a distributed feedback (DFB standing for Distributed Feedback) pulsed laser network whose semiconductor medium includes two sections electrically-insulated from each other, namely a gain section (gain medium) and a section of the saturable absorbent type. Triggering of the laser source is then controlled based on optical pulses converted into electrical pulses by a pair of photodiodes then injected into the gain section. These electrical pulses form exciter or inhibitor synaptic signals. However, the O/E conversion could generate additional losses which could reduce the bandwidth of the spiking photonic neuron as well as the intensity or the power of the emitted laser pulse. In addition, the pair of photodiodes complicate the triggering circuit and reduce the surface density of the network of photonic neurons.

There is also known the scientific article by Uenohara et al. entitled Operation Characteristics of a Side-Light-Injection Multiple-Quantum-Well Bistable Laser for All-Optical Switching, Jpn. J. appl. Phys. Vol. 33 (1994), pp. 815-821. However, it covers a bistable laser and not a pulsed laser.

There is also known the scientific article by Mekemeza-Ona et al. entitled All optical Q-switched laser based spiking neuron, Front. Phys. 10:1017714 (2022) which describes a pulsed laser device made according to the III-V-on-silicon technology.

DISCLOSURE OF THE INVENTION

The invention aims to overcome at least part of the drawbacks of the prior art, and to provide a pulsed laser device including a hybrid pulsed laser source made according to the III-V-on-silicon technology, forming a photonic artificial neuron with optical active triggering (i.e. all optical) and having optimised performances.

For this purpose, an object of the invention is a pulsed laser device including a pulsed laser source and at least one control optical device.

The pulsed laser source is a III-V-on-silicon type hybrid laser source. It includes a semiconductor medium including quantum wells, made based on a III-V compound, located in an optical cavity defining a longitudinal axis, and including at least one gain section and at least one saturable absorber section where the quantum wells are coplanar.

The laser source also includes a photonic substrate, made based on silicon, on which the semiconductor medium rests, and in which a longitudinal waveguide is located involved in defining the optical cavity and optically coupled to the semiconductor medium along the longitudinal axis, the longitudinal waveguide having a width $I_{L/ms}$ and a vertical spacing $d_{L/ms}$ with respect to the semiconductor medium, in a coupling area $zc_{L/ms}$ with the semiconductor medium, predefined so that the optical mode propagating in the longitudinal waveguide has a confinement factor $\Gamma_{L/ms}$ in the quantum wells of the semiconductor medium.

Moreover, the control optical device includes: at least one emitter source adapted to emit at least one control optical pulse with a predefined intensity; and at least one lateral waveguide.

The lateral waveguide is located in the photonic substrate and is optically coupled to the saturable absorber section or to the gain section to transmit the control optical pulse, in an inclined manner with respect to the longitudinal axis to avoid an optical coupling with the optical cavity. It has a width as well as a vertical spacing with respect to the semiconductor medium, in a coupling area with said corresponding section, predefined so that the optical mode propagating in the lateral waveguide has a confinement factor in the quantum wells of said corresponding section higher than $\Gamma_{L/ms}$.

Moreover, the longitudinal waveguide may have a width $I_{L/ms}$ in its coupling area $zc_{L/ms}$, and the lateral waveguide has a width in its coupling area smaller than $I_{L/ms}$.

The longitudinal waveguide may have a vertical spacing $d_{L/ms}$ in its coupling area $zc_{L/ms}$ with respect to the quantum wells of the semiconductor medium, and the lateral waveguide may have a vertical spacing in its coupling area with respect to the quantum wells of the semiconductor medium, where the vertical spacing $d_{L/ms}$ is larger than or equal to that of the lateral waveguide.

The longitudinal waveguide and the lateral waveguide may consist of rib waveguides formed by a slab and by a rib, the lower face of the longitudinal waveguide and that of the lateral waveguide being coplanar.

The longitudinal waveguide may continuously extend under the semiconductor medium.

The lateral waveguide may continuously extend under the corresponding section or include at least one taper coupler.

The semiconductor medium may include at least two gain sections located on either side of the saturable absorber section.

The gain section and the saturable absorber section may consist of portions physically distant from one another, or may consist of areas of the same pad formed by the semiconductor medium.

The control optical device may be an excitation optical device, the emitter source being adapted to emit at least one excitation optical pulse with a predefined intensity. The lateral waveguide, so-called excitation lateral waveguide, could then be optically coupled to the saturable absorber section. The optical mode propagating in the excitation lateral waveguide then has a confinement factor $\Gamma_{lae/SA}$ in the quantum wells of the saturable absorber section higher than $I_{L/ms}$.

The control optical device may be an inhibition optical device, the emitter source being adapted to emit at least one inhibition optical pulse with a predefined intensity. The lateral waveguide, so-called inhibition lateral waveguide, may be optically coupled to the gain section. The optical mode propagating in the inhibition lateral waveguide then has a confinement factor $\Gamma_{lai/G}$ in the quantum wells of the gain section higher than $\Gamma_{L/ms}$.

The pulsed laser device may include an excitation optical device and an inhibition optical device.

The pulsed laser device may include optical intensity attenuators arranged on the lateral waveguides, and adapted to reduce the intensity of the excitation and inhibition optical pulses.

The invention also relates to a photonic artificial neural network, including a plurality of pulsed laser devices according to any one of the preceding features, wherein each pulsed laser source forms a photonic artificial neuron, the photonic artificial neurons being optically connected to each other.

In this network of photonic artificial neurons, a longitudinal waveguide of a pulsed laser device may form a lateral waveguide for exciting or inhibiting another pulsed laser device.

The invention also relates to a method for using a pulsed laser device according to any one of the preceding claims, including the following steps of:

directly polarising the gain section with an electric current with a predefined constant intensity so that the gain g of the semiconductor medium reaches a maximum value $g_{max}$, and applying a zero or inverse polarisation of the saturable absorber section;

emitting an excitation optical pulse by the excitation optical device, causing an emission of a laser pulse by the pulsed laser source if the gain is at least equal to an excitability value $g_{exc}$;

emitting an inhibition optical pulse by the inhibition optical device, preventing the emission of a laser pulse through a reduction of the value of the gain below the excitability value $g_{exc}$.

BRIEF DESCRIPTION OF THE DRAWINGS

Other aspects, aims, advantages and features of the invention will appear better upon reading the following detailed description of preferred embodiments thereof, given as a non-limiting example, and made with reference to the appended drawings, wherein:

FIGS. 6A and 6B are schematic and partial views, in perspective (FIG. 6A) and from the top (FIG. 6B), of a pulsed laser device according to another embodiment, and FIG. 6C is a perspective view of a longitudinal waveguide and of the excitation lateral waveguide illustrated in FIGS. 6A and 6B.

DETAILED DISCLOSURE OF PARTICULAR EMBODIMENTS

In the figures and in the remainder of the description, the same references represent identical or similar elements. In addition, the different elements are not plotted to scale so as to favour clarity of the figures. Moreover, the different embodiments and variants are not mutually exclusive and could be combined together. Unless stated otherwise, the terms "substantially", "about", "in the range of" mean "within a 10% margin", and preferably "within a 5% margin". Moreover, the terms "between . . . and . . . " and equivalents mean that the bounds are included, unless stated otherwise.

Figure 1A:
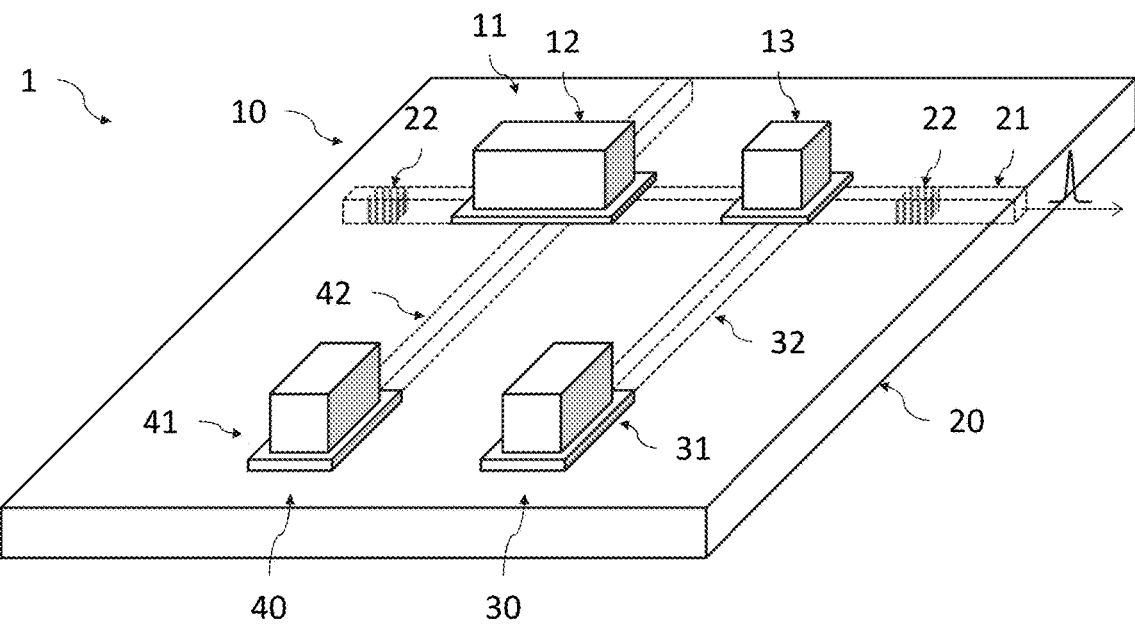
FIGS. 1A and 1B are schematic and partial perspective views, in perspective (FIG. 1A) and in longitudinal section (FIG. 1B), of a pulsed laser device according to an embodiment.
Figure 1A:
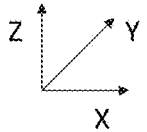
Figure 1B:
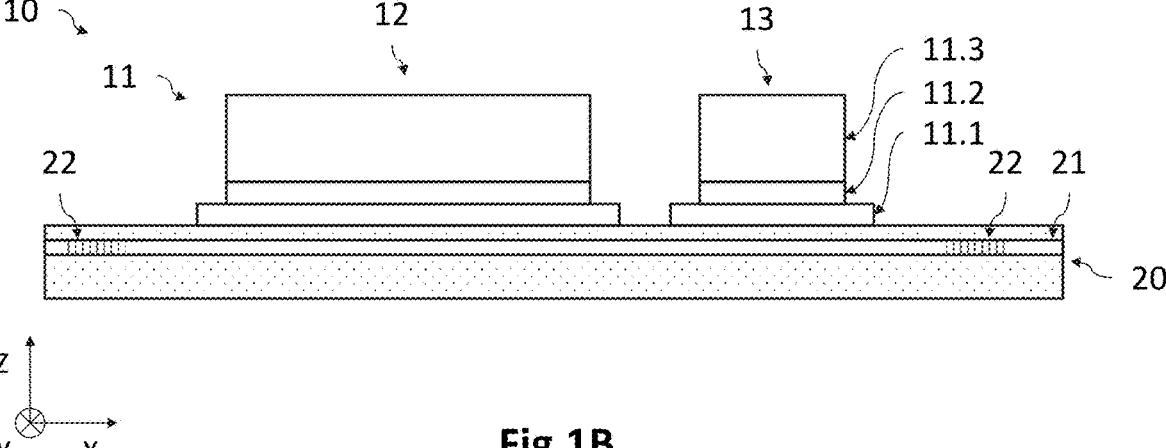

FIG. 1A is a schematic and partial perspective view of a pulsed laser device 1 according to an embodiment, and FIG. 1B is a longitudinal sectional view of the semiconductor medium 11 and of the longitudinal waveguide 21 illustrated in FIG. 1A.

An orthogonal three-dimensional direct reference frame XYZ is herein defined for the following description, where the plane XY is a plane parallel to the plane of the photonic substrate 20, and where the Z axis is directed from the photonic substrate 20 towards the semiconductor medium 11 of the laser source 10. Moreover, the terms "lower" and "upper" should be understood as relating to an increasing positioning when getting away from the photonic substrate 20 along the direction +Z.

The pulsed laser device 1 includes at least: a pulsed and III/V-on-silicon type hybrid laser source 10; and at least one control optical device 30, 40, adapted to cause or inhibit the emission of a laser pulse by the laser source 10.

The laser source 10 is so-called pulsed to the extent that it is adapted to emit laser pulses. It has an optical active triggering since the emission of the laser pulse is triggered or avoided by means of excitation and inhibition optical pulses which are directly transmitted up to the laser source 10, without passing through photodiodes ensuring an O/E conversion. Hence, triggering of the laser emission is not done by modulation of the pumping electric current. Thus, this laser source 10 belongs to the 'all optical' category of triggered mode pulsed laser sources.

Figure 2:
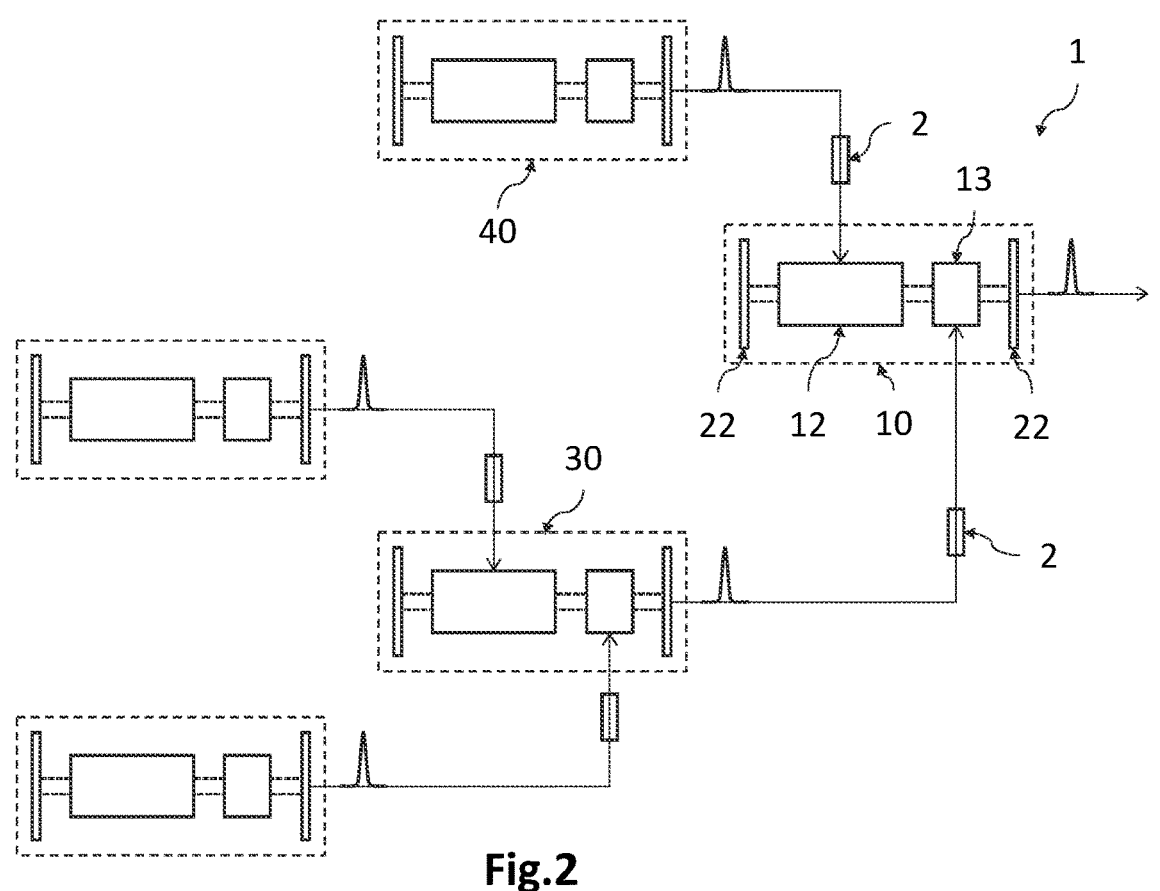
FIG. 2 is a schematic and partial view of a pulsed laser device according to an embodiment, forming a network of photonic artificial neurons.

This pulsed laser device 1 herein consists of a portion of a network of photonic artificial neurons (cf. FIG. 2). More specifically, the laser source 10 forms a photonic artificial neuron. The lateral waveguides 32, 42 consist of synapses and ensure the transmission of the excitation and inhibition synaptic signal up to the laser source 10. As detailed later on, the laser source 10 has properties specific to physiological neurons, such as the excitability and refractory period properties (described later on).

The laser source 10 is so-called III/V-on-silicon type hybrid, to the extent that it includes a semiconductor medium 11 made based on a III-V compound resting on a photonic substrate 20 made based on silicon. The optical cavity is herein delimited by two optical reflectors 22, herein Bragg mirrors (distributed Bragg reflector type laser source, DBR), located in a so-called longitudinal integrated waveguide 21 arranged in the photonic substrate 20. Nonetheless, the optical cavity may also be of the distributed feedback type (DFB) where the same Bragg network extends in the longitudinal waveguide 21 over the entire length of the optical cavity, and possibly be of the ring type, or with Sagnac loop mirrors. The optical cavity defines a longitudinal X axis along which the longitudinal waveguide 21 extends.

Figure 4A:
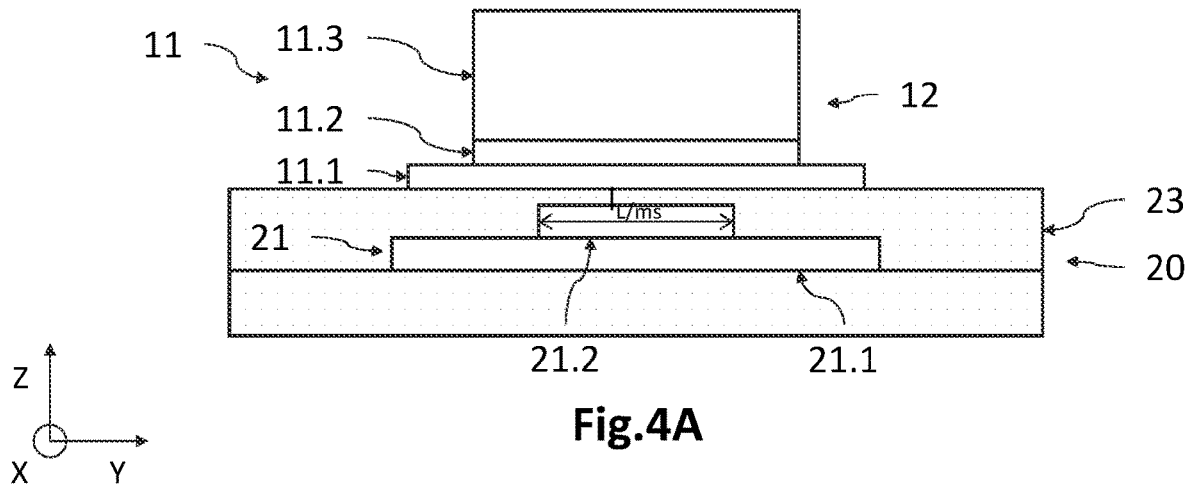
FIG. 4A is a schematic and partial view, in cross-section, of the gain section and of the longitudinal waveguide according to one embodiment.

The photonic substrate 20 is formed by a support substrate, and by waveguides 21, 32, 42 integrated into the support substrate. It may include other passive optical components (multiplexers or demultiplexers, optical fibre couplers, etc.) and/or active optical components (modulators, etc.), optically coupled to each other so as to form an integrated photonic circuit. The photonic substrate 20 may be of the SOI type, i.e. it may include a thin silicon layer and a support substrate made of silicon, between which a so-called BOX (buried oxide) oxide layer is interposed. The waveguides 21, 32, 42 may include a core made of silicone and a sheath made of a silicon oxide. In this example, the integrated waveguides 21, 32, 42 consist, preferably at least in a coupling area with the semiconductor medium 11, of rib guides formed by a rib resting on a slab. The longitudinal waveguide 21 is spaced apart from the semiconductor medium 11 by a layer 23 of silicon oxide with a preferably constant local thickness $e_{gap}$. In FIG. 4A, the slab is denoted 21.1 and the rib is denoted 21.2.

The semiconductor medium 11 rests on the photonic substrate 20 and is located in the optical cavity. It is optically coupled to the longitudinal waveguide 21 above which it is located. It is made of a semiconductor compound, herein of the III-V type. The term III-V refers to the columns III and V of the periodic table of elements. In this example, it includes a semiconductor layer 11.2 containing multiple quantum wells, for example made of InGaAsP or AlGaInAs with a maximum gain for example centred on the wavelength of the laser pulse. The layer of quantum wells 11.2 is surrounded along the vertical Z axis by doped semiconductor layers, for example made of InP, herein by an n-doped lower layer 11.1 and by a p-doped upper layer 11.3. Also, the semiconductor medium 11 includes a PIN junction which extends longitudinally in the plane XY. The semiconductor medium 11 forms a so-called active waveguide optically coupled to the longitudinal waveguide 21.

The semiconductor medium 11 is formed by at least one gain section 12 (optical amplification) and by at least one saturable absorber section 13. In this example, the semiconductor medium 11 includes a gain section 12 and a saturable absorber section 13, but it may include two gain sections located on either side of a saturable absorber section 13 (cf. FIG. 6A), and possibly more. It may include more gain sections and saturable absorber sections. These sections 12, 13 are arranged with respect to one another on the longitudinal X axis of the optical cavity. In addition, they are electrically insulated from each other so that the electrical pumping of one section does not modify the density of free carriers of the other section. Finally, these sections may consist of pads physically separated from each other (cf. FIGS. 1A and 1B), or may consist of electrically-insulated areas of the same pad (cf. FIGS. 6A and 6B).

The gain section 12 is the main site of the optical amplification of the optical mode present in the optical cavity. It is formed by the gain medium of the laser source 10, herein formed by the InP-based semiconductor compounds. It is electrically connected to a polarisation electrical source (not shown), which ensures the direct polarisation of the gain section 12. The intensity of the pumping current is defined so that the gain g of the semiconductor medium 11, reaches, in the stationary regime, a constant maximum value $g_{max}$. In a known manner, the gain g is correlated with the density ng of free carriers injected in the gain section 12 by the electrical source (electrical pumping). Moreover, the stationary regime corresponds, as detailed later on, to the regime where the gain is maximum and constant and where no optical pulse is received by the gain section 12 and by the saturable absorbent section 13 (the optical losses in the optical cavity are then high enough to prevent the emission of a laser pulse). In this case, the optical losses are essentially associated with the transmission coefficient of the material of the saturable absorbent section 13.

The saturable absorber section 13 has a controllable optical shutter function. In a known manner, a saturable absorber is a medium whose optical transmission coefficient, at the wavelength of the laser emission, varies according to the incident optical intensity. Thus, the transmission is low and possibly negligible at low incident optical intensities, whereas it is high at high optical intensities (the material then becomes transparent). The saturable absorber section 13 may then occupy two main states and an intermediate state:

a rest state, so-called blocking state, when the incident optical intensity is low. In this state, the transmission coefficient is low so that the optical losses in the optical cavity are high, at least equal to a predefined value $\alpha_{max}$;

a passing state, when the incident optical intensity is high. In this state, the transmission coefficient is high (the material is transparent to the wavelength of the laser emission) so that the optical losses are low, at most equal to a predefined value $\alpha_{min}$. The material is so-called saturated.

an intermediate state, for which the optical losses are comprised between $\alpha_{min}$ and $\alpha_{max}$ (excluding these values). The material is then subjected to an incident light beam, but is not saturated.

In this example, the saturable absorber section 13 has a semiconductor heterostructure identical to that of the gain section 12 in terms of material, doping, and thickness of the layers. Also, the quantum wells of the gain section 12 and those of the saturable absorber section 13 are coplanar. Moreover, unlike the gain section 12, the saturable absorber section 13 is not directly polarised, but is reversibly polarised namely with a zero potential difference. Finally, it advantageously has a length, along the longitudinal X axis, smaller than that of the gain section 12 (and, where appropriate, than the cumulated length of the gain sections), and preferably has a length comprised between about 2% and 10% of this cumulated length. Thus, the saturable absorber section 13 has saturation/desaturation dynamics conducive to the emission of particularly short and intense laser pulses.

For example, the semiconductor heterostructure of the gain section 12 and of the saturable absorber section 13 is formed by a lower semiconductor layer 11.1 made of n-doped InP with a thickness of 150 nm. It includes a semiconductor layer 11.2 with quantum wells based on AlGaInAs with a thickness of 300 nm, and a higher semiconductor layer 11.3 made of InP with a thickness of about 2 μm. The length of the gain section 12 may be equal to 600 μm and that of the saturable absorber section 13 may be equal to 20 μm.

Hence, the polarisation electrical source (not shown) ensures the direct polarisation of the gain section 12 (electrical pumping) and herein applies a zero polarisation to the saturable absorber section 13 ($I_{SA}$=0 mA). Alternatively, it may apply a reverse polarisation thereto. The electrical source transmits a continuous electric current in the gain section 12 whose intensity is predefined so that the gain tends to a maximum stationary value $g_{max}$ of the gain. This maximum value $g_{max}$ is lower than the optical losses $\alpha_{max}$ when the saturable absorber section 13 occupies the blocking state (herein when it is not illuminated by an optical pulse originating from the excitation optical device 30 and with enough power to make the section 13 transparent), so as to avoid the emission of a continuous laser signal.

Thus, for example, the threshold electric current may be equal to 16 mA, a value for which the gain $g_{th}$ (higher than the value $g_{max}$) balances the high optical losses $\alpha_{max}$ of the saturable absorber section 13 in the blocking state, thereby causing the emission of a series of laser pulses. Also, to be able to actively "trigger" the emission of a laser pulse, the value of the pumping electric current is defined at a value lower than this threshold current, for example at about 15 mA, so that the maximum value $g_{max}$ of the gain in the stationary regime namely much lower than the threshold value $g_{th}$ and therefore does not balance the maximum optical losses $\alpha_{max}$. However, as detailed later on, the value $g_{max}$ of the gain is high enough to be at least equal to the optical losses $\alpha_{min}$ when the saturable absorber section 13 occupies the passing state (herein when it is illuminated by an optical pulse originating from the excitation optical device 30).

The pulsed laser device 1 includes one or more control optical device(s) 30, 40, and includes, in this example, an excitation optical device 30 and an inhibition optical device 40. Of course, it may include several excitation optical devices 30 and/or several inhibition optical devices 40.

Each control optical device 30, 40 includes: at least one emitter source 31, 41 adapted to emit at least one control optical pulse with a predefined intensity; and at least one lateral waveguide 32, 42. The same emitter source may be coupled to one or more lateral waveguide(s), and the same lateral waveguide may be coupled to one or more emitter source(s).

The emitter source 31, 41 may be located over the photonic substrate 20 (as illustrated in FIG. 1A) but, alternatively, it may be located off the photonic substrate 20 while being coupled to the lateral waveguide by an optical coupler. Active or passive optical elements (modulator, multiplexer, coupling network . . . ) may be coupled to the lateral waveguide, and be located between the corresponding emitter source and the semiconductor medium 11.

As indicated in detail later on, each lateral waveguide has dimensional properties in terms of width and vertical spacing, in a coupling area with the corresponding section of the semiconductor medium 11 (i.e. the saturable absorber section 13 in the case of excitation, and the gain section 12 in the case of inhibition), predefined so that the confinement factor of the optical mode n the quantum wells of the corresponding section is higher than the confinement factor of the optical mode (propagating in the longitudinal waveguide 21) in the quantum wells of the semiconductor medium 11.

The excitation optical device 30 includes an emitter source 31 adapted to emit a so-called excitation optical pulse, and a so-called lateral waveguide 32 allowing transmitting the excitation optical pulse up to the saturable absorber section 13. This lateral waveguide 32 is integrated into the photonic substrate 20 and is optically coupled to the saturable absorber section 13 yet without being optically coupled to the optical cavity. For this purpose, the lateral waveguide 32 is coupled to the saturable absorber section 13 in an inclined manner in the plane XY with respect to the longitudinal X axis. Also, the photons of the excitation optical pulse, not absorbed by the saturable absorber section 13, do not propagate along the longitudinal X axis in the optical cavity. In this example, the angle of inclination formed by the lateral waveguide 32 with respect to the longitudinal X axis, at the saturable absorber section 13, is for example comprised between 60° and 120°. In this example, it is equal to about 90°. Preferably, it is coplanar with the longitudinal waveguide 21 (it may be derived from the same thin later made of monocrystalline silicon of a SOI substrate), to the extent that the lower face of the lateral waveguide 32 is coplanar with that of the longitudinal waveguide 21.

The excitation optical pulse has a predefined optical intensity and a wavelength, herein equal to the wavelength of the laser oscillation (comprised in the absorption spectrum of the saturable absorber section 13). It may cause the emission of a laser pulse by the laser source 10 when the gain has a maximum stationary value $g_{max}$. As detailed later on, the fact that the gain has this maximum value $g_{max}$ reflects the fact that the laser source 10 is actually capable of emitting a laser pulse: it is then followed by a so-called refractory period during which it is not capable of emitting a laser pulse, even though it would have received an excitation optical pulse.

In other words, when the saturable absorber section 13 is not illuminated by the excitation optical pulse, it has a minimum transmission reflected by maximum optical losses $\alpha_{max}$. The pump current injects a free carrier density in the gain section 12 reflected, in the stationary regime, by a maximum gain value $g_{max}$. This maximum value $g_{max}$ is lower than a threshold value $g_{th}$ that would balance the maximum optical losses $\alpha_{max}$ of the saturable absorber section 13 and would cause the emission of a laser signal. Also, in the stationary regime, the laser source 10 does not receive any excitation optical pulse and therefore it does not emit any laser pulse.

However, when the saturable absorber section 13 is saturated, it has a maximum transmission, reflected by minimum optical losses $\alpha_{min}$. The maximum value $g_{max}$ of the gain is then at least equal to the minimum value $\alpha_{min}$ of the optical losses, so that, when the saturable absorber section is illuminated by the excitation optical pulse and when it is saturated, the laser source 10 then emits an optical pulse.

The pulsed laser device 1 may also include an inhibition optical device 40. The latter includes an emitter source 41 adapted to emit a so-called inhibition optical pulse, and an inhibition lateral waveguide 42 allowing transmitting the inhibition optical pulse up to the gain section 12. This lateral waveguide 42 is also integrated into the photonic substrate 20 and is optically coupled to the gain section 12 yet without being optically coupled to the optical cavity. For this purpose, like with the lateral waveguide 32, the lateral waveguide 42 is coupled to the gain section 12 in an inclined manner in the plane XY with respect to the longitudinal X axis. Also, the photons of the inhibition optical pulse not propagating along the longitudinal X axis in the optical cavity. In this example, the angle of inclination is comprised between 60° and 120°, and is herein equal to about 90°. Preferably, it is coplanar with the longitudinal waveguide 21 (it may be derived from the same thin later made of monocrystalline silicon of a SOI substrate), to the extent that the lower face of the lateral waveguide 42 is coplanar with that of the longitudinal waveguide 21.

The inhibition optical pulse has a predefined optical intensity and herein a wavelength equal to that of the laser oscillation. It may allow avoiding the emission of a laser pulse by the laser source 10. For this purpose, as detailed later on, such an optical pulse received by the gain section 12 causes a decrease in the value of the gain, which then has a transitional value lower than the maximum value $g_{max}$, but also lower than a so-called excitability value $g_{exc}$ from which the laser source 10 could emit a laser pulse when the saturable absorber section 13 receives the excitation optical pulse and when it is saturated.

In other words, when the gain has a value, in the stationary regime, higher than or equal to the excitability value $g_{exc}$, but lower than the threshold value $g_{th}$ (and therefore lower than the maximum optical losses $\alpha_{max}$). The laser source 10 emits, or not, a laser pulse according to the saturable absorber section 13 receives, or not, an excitation optical pulse. However, when the gain has a transitional value lower than the excitability value $g_{exc}$, the laser source 10 does not emit a laser pulse, even though the saturable absorber section 13 would receive an excitation optical pulse.

FIG. 2 is a schematic and partial view of a pulsed laser device 1 according to an embodiment where it corresponds to a network of photonic artificial neurons. The laser source 10 forms a photonic artificial neuron, which is connected to the excitation 30 and inhibition 40 optical devices by the lateral waveguides of these. Thus, these lateral waveguides form synapses of the photonic artificial neuron 10. In this example, the excitation 30 and inhibition 40 optical devices consist of pulsed laser sources identical or similar to that of the pulsed laser device 1, and therefore also form photonic artificial neurons.

The whole herein consist of a portion of a network of photonic artificial neurons with 'all optical' type active triggering, in the III/V-on-silicon hybrid configuration where the different waveguides are integrated into the photonic substrate. Hence, the excitation optical pulses consist of synaptic signals whose weight has a positive sign and whose intensity could be modified by the optical intensity attenuators. Similarly, the inhibition optical pulses therefore consist of synaptic signals whose weight has a negative sign whose intensity could be modified.

It should be noted that the pulsed laser device 1 may include intensity attenuators 2 (cf. FIG. 2), coupled to the lateral waveguides 32, 42, to attenuate, or not, the intensity of the transmitted excitation and inhibition optical pulses. Such attenuators 2 may consist of Mach-Zehnder type or resonant ring type modulators. It may also consist of phase-change materials selected in particular from among chalcogenides, in particular of the GST type, i.e. formed based on germanium Ge, antimony Sb, and tellurium Te. Reference may be made to the document by Abdollahramezani et al. entitled *Tunable nanophotonics enabled by chalcogenide phase-change materials*, Nanophotonics 2020, 9(5), 1189-1241.

In the following description, the confinement factor in the quantum wells of the semiconductor medium 11 of the optical mode that propagates in the longitudinal waveguide 21 is denoted $\Gamma_{L/ms}$. Similarly, the confinement factor in the quantum wells of the saturable absorber section 13 of the optical mode that propagates in the excitation lateral waveguide 32 is denoted $\Gamma_{lae/SA}$. And finally, the confinement factor in the quantum wells of the gain section 12 of the optical mode that propagates in the inhibition lateral waveguide 42 is denoted $\Gamma_{lai/G}$.

The longitudinal waveguide 21, the lateral waveguide 32, and the lateral waveguide 42 have predefined dimensional properties in their respective coupling areas, so that the confinement factor $\Gamma_{lae/SA}$ and the confinement factor $\Gamma_{lai/G}$ are higher than the confinement factor $\Gamma_{L/ms}$.

More specifically, the dimensional properties mainly consist of the width I of the integrated waveguides and their vertical spacing d with respect to the semiconductor medium 11 (and therefore with respect to the quantum wells of the latter). Hence, the longitudinal waveguide 21 has a width $I_{L/ms}$ and a vertical spacing $d_{L/ms}$, which are defined in a coupling area $z_{L/ms}$ with the semiconductor medium 11, so that the optical mode circulating in the longitudinal waveguide 21 has a confinement factor $\Gamma_{L/ms}$ in the quantum wells of the semiconductor medium 11.

Figure 5A:
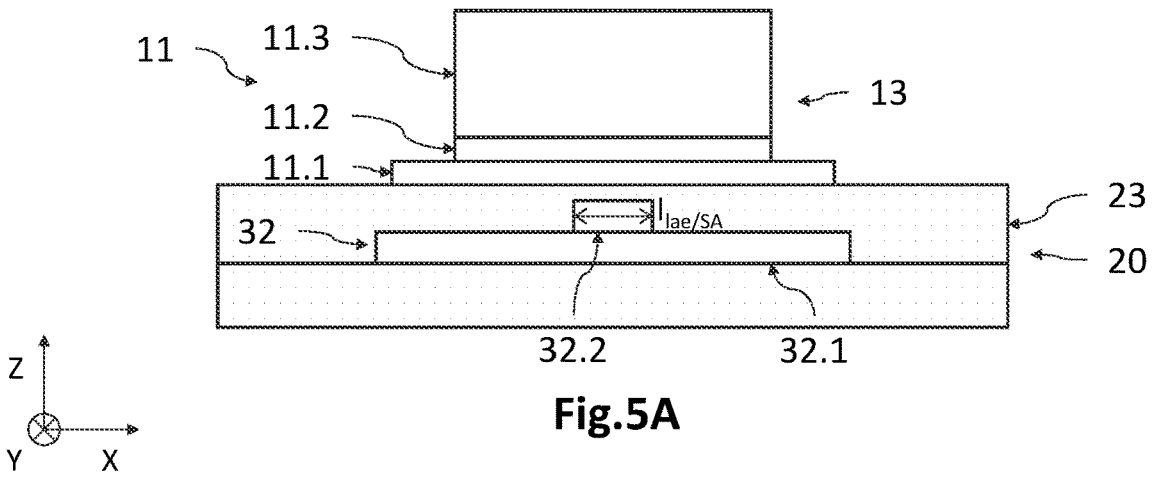
FIG. 5A is a schematic and partial view, in cross-section, of the saturable absorber section and of the excitation lateral waveguide according to an embodiment.

The waveguides 21, 32, 42 may consist of rib waveguides formed by a slab and a rib. The rib may be located on the side of the semiconductor medium 11, as illustrated in FIGS. 4A, 5A and 6A, but alternatively it may be located on the opposite side. The width I of the waveguide is then the distance, along a transverse axis in the plane XY, between the sidewalls of the rib. In the case of a waveguide with a rectangular section (no rib), the width I is then the transverse distance in the plane XY between the sidewalls of the waveguide. Moreover, the vertical spacing d is the distance, along the Z axis, between the upper face of the waveguide (in the case of a rib guide: upper face of the rib or of the slab, according to the position of the rib) and the lower face of the semiconductor medium 11.

Similarly, the lateral waveguide 32 therefore has a width $I_{lae/SA}$ and a vertical spacing $d_{lae/SA}$, which are defined in a coupling area $z_{lae/SA}$ with the saturable absorber section 13, such that the optical mode circulating in the lateral waveguide 32 has a confinement factor $\Gamma_{lae/SA}$ in the quantum wells of the saturable absorber section 13. The width $I_{lae/SA}$ and the vertical spacing $d_{lae/SA}$ are predefined so that $\Gamma_{lae/SA}$ is higher than $\Gamma_{L/ms}$, for example 10 times higher.

Finally, the lateral waveguide 42 has a width $I_{lai/G}$ and a vertical spacing $d_{lai/G}$, which are defined in a coupling area $z_{lai/G}$ with the gain section 12, such that the optical mode circulating in the lateral waveguide 42 has a confinement factor $\Gamma_{lai/G}$ in the quantum wells of the gain section 12. The width $I_{lai/G}$ and the vertical spacing $d_{lai/G}$ are predefined so that $\Gamma_{lai/G}$ is higher than $I_{L/ms}$, for example 10 times higher.

This then allows improving the performances of the pulsed laser device 1. Indeed, when the optical mode circulating in the optical cavity, and therefore in the longitudinal waveguide 21, has a confinement factor $\Gamma_{L/ms}$ in the quantum wells of the semiconductor medium 11, which is low for example in the range of 1 to 2%, the saturated gain of the laser source 10 is high, which allows obtaining laser pulses with a higher energy. Hence, the value of the confinement factor $\Gamma_{L/ms}$ has to remain low.

However, when the optical modes of the control signals, i.e. those circulating in the lateral waveguides 32 and 42, have a high confinement factor in the quantum wells of the saturable absorber section 13 (for the optical mode circulating in the guide 32) and in those of the gain section 12 (for the optical mode circulating in the guide 42), the emission efficiency and the inhibition efficiency are optimised. Indeed, the photons laterally injected into the saturable absorber section 13 cause a maximum excitation of free carriers, which locally increases the population inversion, and therefore makes the absorption saturate more efficiently. Similarly, the photons injected laterally into the gain section 12 cause a maximum stimulated emission, which locally reduces the population inversion, and therefore makes the gain drop efficiently.

In this configuration, the optical mode propagating in the longitudinal waveguide 21 has a low confinement factor $\Gamma_{L/ms}$ in the quantum wells of the semiconductor medium 11, while the optical mode propagating in the lateral waveguide 32 has a higher confinement factor $\Gamma_{lae/SA}$ in the quantum wells of the saturable absorber section 13 (like the lateral waveguide 42 which has a higher confinement factor $\Gamma_{lai/G}$).

Also, in the context of a pulsed laser device 1 according to the invention, where the laser source 10 has a III-V-on-Si configuration, it is possible to simply optimise the performances, by adjusting the width $I_{L/ms}$ and/or the vertical spacing $d_{L/ms}$ of the longitudinal waveguide 21 in its coupling area $zc_{L/ms}$ with the semiconductor medium 11, and by adjusting the width $I_{lae/SA}$ and/or the vertical spacing $d_{lae/SA}$ of the lateral waveguide 32 in the coupling area $zc_{lae/SA}$. Similarly, it is possible to adjust the width $I_{lai/G}$ and/or the vertical spacing $d_{lai/G}$ of the lateral waveguide 42 in its coupling area $zc_{lai/G}$ with the gain section 12. We herein profit from the fact that the waveguides 21, 32 and 42 are waveguides integrated into the photonic substrate 20, and that these width and vertical spacing parameters could be adjusted simply and independently of the semiconductor medium 11.

In addition, the fact that the confinement factor $\Gamma_{lae/SA}$ and/or $\Gamma_{lai/G}$ is higher than $\Gamma_{L/ms}$ allows improving the performances of the pulsed laser device 1 by a concomitant effect, on the one hand, of an optimisation of the saturated gain of the laser source 10 and of the emission and/or inhibition efficiencies and, on the other hand, by a limitation of leakages by optical transfer related to a strong overlap of the longitudinal and lateral optical modes.

Indeed, on this last point, having confinement factors $\Gamma_{L/ms}$ and $\Gamma_{lae/SA}$ (and $\Gamma_{lai/G}$) with the same value is reflected by a strong local spatial overlap of the longitudinal optical mode and of the lateral optical mode at the intersection between these optical modes. Such an overlap could lead to an optical transfer from one mode to another (crosstalk), leading to a degradation of the performances.

Also, having different confinement factors between $\Gamma_{L/ms}$ on the one hand and $\Gamma_{lae/SA}$ and $\Gamma_{lai/G}$ on the other hand allows reducing this local spatial overlap of the optical modes and therefore the risks of transfer between the optical modes; and having, a fortiori, $\Gamma_{lae/SA}$; $\Gamma_{lai/G} > \Gamma_{L/ms}$ allows optimising both the saturated gain and the emission and inhibition efficiency. Thus, the performances of the pulsed laser device 1 are optimised.

Preferably, the lateral waveguide(s) is/are configured so that the confinement factor $\Gamma_{lae/SA}$, like the confinement factor $\Gamma_{lae}/G$, features a difference with the confinement factor $\Gamma_{L/ms}$ at least equal to 5%, and possibly 8%, still possibly 10%. Thus, for example, if the confinement factor $\Gamma_{L/ms}$ is equal to 1%, the confinement factors $\Gamma_{lae/SA}$ and $\Gamma_{lai/G}$ are at least equal to 6%, and possibly 9%, possibly 11%. This allows reducing this local spatial overlap of the optical modes.

Figure 3:
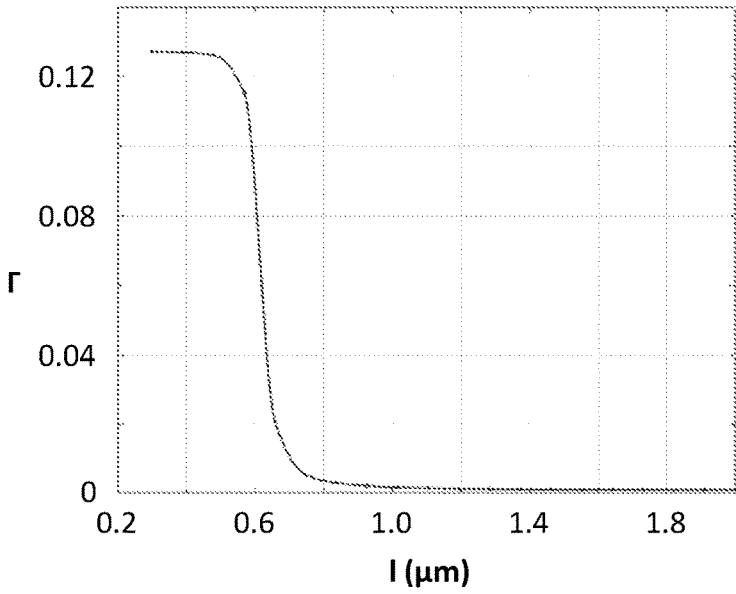
FIG. 3 is an example of evolution, as a function of the width I of the integrated waveguide, of the confinement factor $\Gamma$ of an optical mode, circulating in the integrated waveguide, in the quantum wells of a semiconductor medium optically coupled to the integrated waveguide.

FIG. 3 illustrates an example of the evolution of the confinement factor $\Gamma$ of an optical mode, propagating in an integrated rib waveguide, in the quantum wells of the semiconductor medium 11, as a function of the width I of the waveguide, and herein of its rib.

In this example, the semiconductor medium 11 includes a lower portion 11.1 made of n-type doped InP with a thickness of 150 nm. The portion 11.2 is formed by a lower confinement portion made of AlGaInAs with a thickness of 90 nm, by a central portion with AlGaInAs-based quantum wells with a thickness of 120 nm, and by an upper confinement portion made of InGaAsP with a thickness of 90 nm. The upper portion 11.3 made of p-type doped InP has a thickness of 2 μm. The portions 11.2 and 11.3 have a width of 5 μm.

Moreover, for example, the integrated waveguide is made of silicon and surrounded by a silicon oxide. It is formed by a slab 21.1 with a width of 15 μm and a thickness of 300 nm, and by a rib 21.2 with a width I to be varied and with a thickness of 200 nm. The waveguide is vertically spaced apart from the semiconductor 11 by a distance of 100 nm.

The confinement factor $\Gamma$ of the optical mode in the quantum wells is determined by the Lumerical software for numerically simulating the electromagnetics equation by the MODE-FDE mode solver. It appears that the confinement factor $\Gamma$ is a decreasing function with the with I of the waveguide, and features a strong decrease around a threshold value, herein in the range of 0.6 μm. Also, it appears that it is possible to simultaneously and simply adjust the width $I_{L/ms}$ of the longitudinal waveguide 21 in its coupling area with the semiconductor medium 11 so that the confinement factor $\Gamma_{L/ms}$ is around 1 to 2%, and to adjust the width $I_{lae/SA}$ of the lateral waveguide 32 in its coupling area with the saturable absorber section 13, and the width $I_{lai/G}$ of the lateral waveguide 42 in its coupling area with the gain section 12, so that the respective confinement factors $\Gamma_{lae/SA}$ and $\Gamma_{lai/G}$ are maximum, and herein around 13%.

Preferably, the vertical spacing d of the integrated waveguides 21, 32, 42 with respect to the semiconductor medium 11 and therefore with respect to the quantum wells are identical. The lateral waveguides 32, 42 then have a respective width $I_{lae/SA}$ and $I_{lai/G}$ smaller than the width $I_{L/ms}$ of the longitudinal waveguide 21. This is illustrated in FIGS. 4A-4C and 5A-5D. Alternatively or complementarily, the respective vertical spacing $d_{lae/SA}$ and $d_{lai/G}$ of the lateral waveguides 32, 42 may be smaller than the vertical spacing $d_{L/ms}$ of the longitudinal waveguide 21.

FIG. 4A is a schematic and partial view, in cross-section, of the gain section 12 and of the longitudinal waveguide 21. The width $I_{L/ms}$ of the longitudinal waveguide 21 is herein that of its rib 21.2 in the coupling area $zc_{L/ms}$ to the extent that it is this parameter which affects the confinement factor $\Gamma_{L/ms}$. The rib 21.2 has an upper face opposite to the slab 21.1, and sidewalls. These are herein substantially vertical. As indicated before, the width $I_{L/ms}$ is the transverse distance, along the Y axis, between the sidewalls of the rib 21.2. The vertical spacing $d_{L/ms}$ is the distance along the Z axis, defined in the coupling area $zc_{L/ms}$, between the upper face of the rib 21.2 and the lower face of the semiconductor medium 11. In this example, $d_{L/ms}$ is equal to $d_{lae/SA}$ and to $d_{lai/G}$.

Figure 4B:
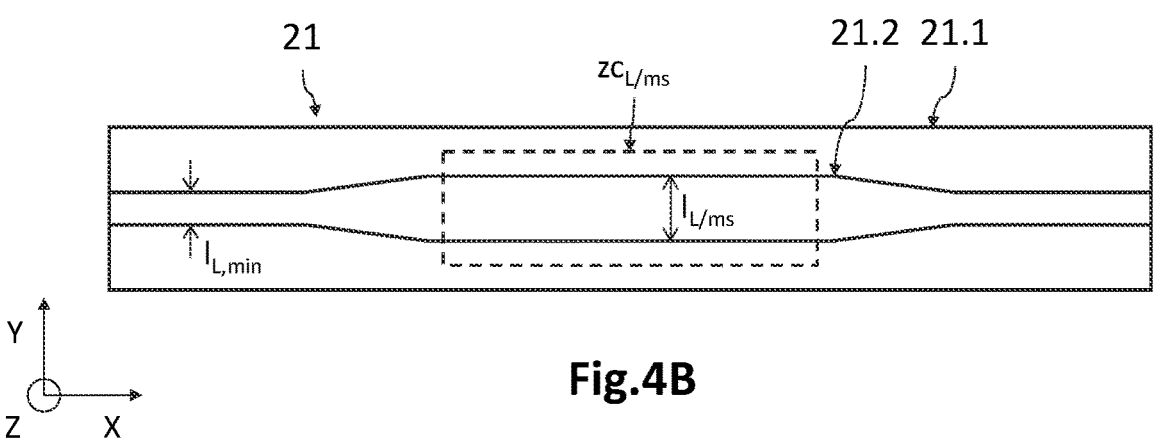
FIGS. 4B and 4C are top views of the longitudinal waveguide according to some embodiments.

FIG. 4B is a schematic and partial view, in top view, of the longitudinal waveguide 21 according to one embodiment. The coupling area with the semiconductor medium 11 is illustrated in dotted line. Hence, the gain section 12 and the saturable absorber section 13 are located in this coupling area $zc_{L/ms}$. In this example, the longitudinal waveguide 21 has a rib 21.2 with a minimum constant width $I_{L,min}$ in the areas upstream and downstream of the coupling area $zc_{L/ms}$, this width being herein smaller than the value $I_{L/ms}$. For example, the width I may be equal to 400 nm while the width $I_{L/ms}$ may herein be equal to 700 nm. The longitudinal waveguide 21 has intermediate areas where the width passes from the value $I_{L,min}$ to the value $I_{L/ms}$.

Figure 4C:
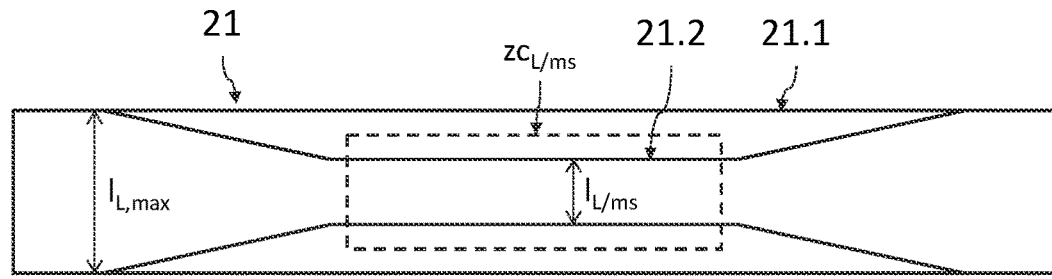

FIG. 4C is a schematic and partial view, in top view, of the longitudinal waveguide 21 according to another embodiment. In this example, the longitudinal waveguide 21 is a guide with a rectangular section upstream and downstream of the coupling area. Indeed, the width $I_L$ of the rib increases from the coupling area $zc_{L/ms}$ until reaching the width of the slab 21.1, for example herein 15 μm. Hence, the longitudinal waveguide 21 has intermediate areas where the width passes from the maximum value $I_{L,max}$ to the value $I_{L/ms}$.

FIG. 5A is a schematic and partial view, in cross-section, of the saturable absorber section 13 and of the lateral waveguide 32. The width $I_{lae/SA}$ of the lateral waveguide 32 is herein that of its rib 32.2 in the coupling area $zc_{lae/SA}$. The rib 32.2 has an upper face opposite to the slab 32.1, and sidewalls. These are herein also substantially vertical. The width $I_{lae/SA}$ is the transverse distance, along the X axis, between the sidewalls of the rib 32.2. The vertical spacing $d_{lae/SA}$ is the distance along the Z axis, defined in the coupling area $zc_{lae/SA}$, between the upper face of the rib 32.2 and the lower face of the saturable absorber section 13 of the semiconductor medium 11. In this example, $d_{L/ms}$ is equal to $d_{lae/SA}$ and to $d_{lai/G}$.

Figure 5B:
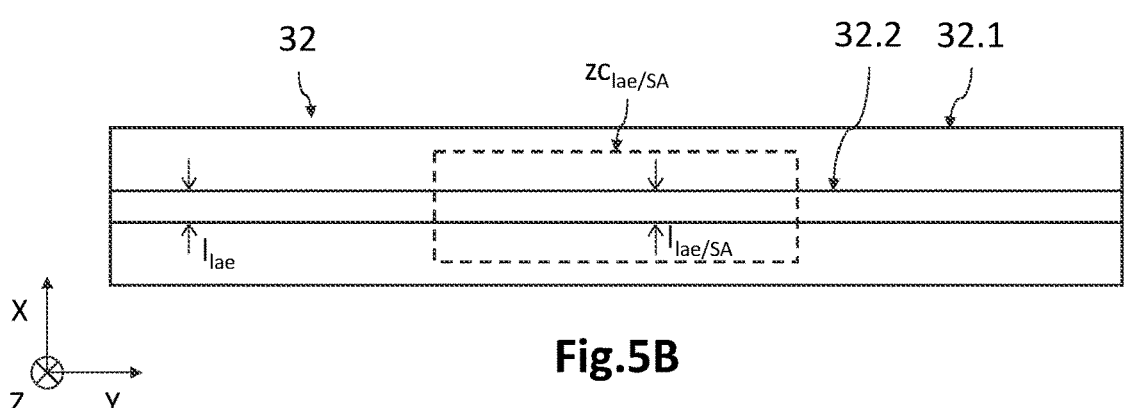
FIGS. 5B to 5D are top views of the lateral waveguide according to some embodiments.

FIG. 5B is a schematic and partial view, in top view, of the lateral waveguide 32 according to one embodiment. The coupling area $zc_{lae/SA}$ with the saturable absorber section 13 is shown in dotted line (the saturable absorber section 13 is therefore located in this coupling area). In this example, the lateral waveguide 32 has a rib with a constant width $I_{lae/SA}$ both in the coupling area $zc_{lae/SA}$ and in the upstream and downstream areas. For example, the width $I_{lae/SA}$ may be equal to 400 nm.

Figure 5C:
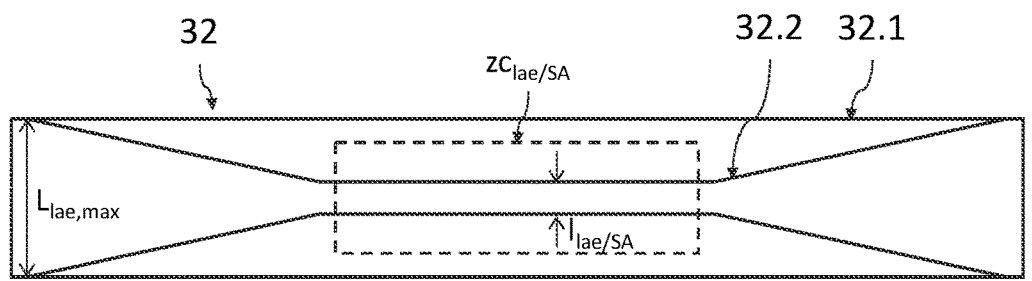

FIG. 5C is a schematic and partial view, in top view, of the lateral waveguide 32 according to another embodiment. In this example, it consists of a guide with a rectangular section upstream and downstream of the coupling area $zc_{lae/SA}$. Indeed, the width of the rib increases from the coupling area until reaching the width of the slab 32.1, for example herein 15 μm. The lateral waveguide 32 has intermediate areas where the width passes from the maximum value $I_{lae,max}$ to the value $I_{lae/SA}$.

Figure 5D:
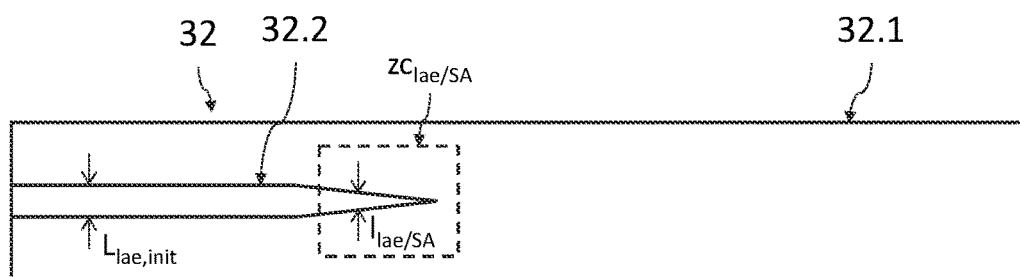

FIG. 5D is a schematic and partial view, in top view, of the lateral waveguide 32 according to another embodiment. In this example, it has a taper. Indeed, the width of the rib 32.2 herein passes from an initial value $I_{lae,init}$ to a zero value. This variation of the width is adiabatic so that the optical mode entirely passes from the lateral waveguide 32 in the saturable absorber section 13. Thus, the taper coupler is located in the coupling area $zc_{lae/SA}$, so that the width of the lateral waveguide 32 decreases to a zero value $I_{lae/SA}$. The coupling area $zc_{lae/SA}$ substantially corresponds to the vertical overlap area between the saturable absorber section 13 and the taper coupler.

FIGS. 6A to 6C illustrate schematic and partial views of a pulsed laser device 1 according to one variant. In this case, the semiconductor medium 11 includes, arranged longitudinally along the longitudinal X axis, a first gain section 12, a saturable absorber section 13, and a second gain section 12. In this example, the vertical spacing $d_{L/ms}$ is equal to $d_{lae/SA}$ and to $d_{lai/G}$.

These sections 12, 13 are not physically separated from each other, but, on the contrary, form areas of the same semiconductor pad. The electrical insulation between the sections in pairs is herein achieved by an indentation 14 located at the interface between the saturable absorber section 13 and each of the gain sections 12, at which an appropriate doping is performed, for example through an H+ proton implantation.

As mentioned before, the length along the X axis of the saturable absorber section 13 is preferably smaller than the cumulated length of the gain sections 12, and is preferably in the range of 2 to 10% of this cumulated length of the gain sections 12. Thus, the saturable absorber section 13 has a short saturation/desaturation time, conducive to the emission of short-period laser pulses.

Moreover, the semiconductor medium 11 may include a plurality of sections electrically insulated from each other, each connected to an electrical polarisation source. The sign of the electrical voltage applied to each of the sections could determine whether the considered section is a gain section 12 or a saturable absorber section 13. In addition, the intensity of the applied electrical voltage may correspond to the weight $w_i$ applied to the inhibition or excitation synaptic signal.

It should be noted that the optical coupling between the longitudinal waveguide 21 and the semiconductor medium 11 is herein a supermode-type coupling (an optical coupling type that is found in DFB lasers) to the extent that the longitudinal waveguide 21 continuously extend under the semiconductor medium 11. However, the lateral waveguide 32 includes a taper coupler, so that the guided mode progressively passes from the waveguide 32 in the saturable absorber section 13 (an optical coupling type that is found in DBR lasers). This could also be the case for the lateral waveguide 42 (not illustrated herein).

The longitudinal waveguide 21 has a width $I_{L/ms}$ of its rib 21.2 in the coupling area with the semiconductor medium 11. Preferably, the slab 21.1 has a larger width in this coupling area, which may contribute to reducing the confinement factor $\Gamma_{L/ms}$.

The lateral waveguide 32 herein has a taper coupler, so that its width $I_{lae/SA}$ decreases in the coupling area to a zero value. Preferably, the slab 32.1 has a width which also decreases in the coupling area, herein too to a zero value, which contributes to increasing the confinement factor $\Gamma_{lae/SA}$.

Given the foregoing, it is possible to summarise the operation of triggering of the laser source 10 by the table hereinbelow, depending on whether the saturable absorber section 13 is illuminated or not by an excitation optical pulse, and depending on whether the laser source 10 is in an excitability regime or not:

|  | Off the excitability regime: $g < g_{exc}$ | Excitability regime: $g_{exc} \leq g \leq g_{max}$ |
| --- | --- | --- |
| Excitation: emission of an excitation pulse | Optical losses $\alpha_{min} < \alpha < \alpha_{max}$ No saturation $\Rightarrow$ Intermediate state No laser pulse | Optical losses $\alpha \leq \alpha_{min}$ Saturation $\Rightarrow$ Passing state Laser pulse emission |
| No excitation: no emission of an excitation pulse | Optical losses $\alpha_{max} \leq \alpha$ Blocking state No laser pulse | Optical losses $\alpha_{max} \leq \alpha$ Blocking state No laser pulse |

It should be understood that the non-excitability regime of the laser source 10 corresponds in particular to two situations. A first situation corresponds to the refractory period: the gain, under the effect of the pumping current, progresses, but has not yet reached a value denoted $g_{exc}$. In this case, the gain is not enough to participate, with the excitation optical pulse, in saturating the saturable absorber section 13 and therefore to enabling the emission of a laser pulse. A second situation corresponds to inhibition: the refractory period is completed, but the inhibition optical pulse causes a decrease in the gain which passes below the value $g_{exc}$ and therefore results in leaving the excitability regime. Herein again, the gain is no longer enough to participate in saturating the saturable absorber section 13 and therefore to enabling the emission of the laser pulse.

Thus, this behaviour of physiologic neurons is found in terms of excitability and in terms of refractory period. The neuron remains at rest when it is not excited. It does not emit any signal when it is in the refractory period (following the emission of a signal), and can emit a signal when it has left the refractory period and when it is excited by signals with enough intensity. The operation of such a pulsed laser device 1 is described in the patent application FR3123163 A1.

Thus, the pulsed laser device 1 according to the invention includes a III-V-on-Si type hybrid laser source with 'all optical' active triggering. It effectively replicates the excitability and refractory period properties of physiological neurons. The excitability and inhibition synaptic signals herein consist of optical pulses transmitted directly up to the sections 12, 13 of the semiconductor medium 11 of the laser source 10, without an O/E conversion taking place. This is enabled by the hybrid configuration of the laser source 10, where the lateral waveguides 32, 42 are integrated into the photonic substrate 20 yet without being optically coupled to the optical cavity. Thus, the drawbacks of the photonic artificial neurons of the prior art of the 'O/E/O conversion' type are avoided, in particular the drawbacks related to the O/E conversion and to the presence of the photodiodes. The drawbacks of the photonic neurons of the prior art of the 'all optical' type are also avoided such as those related to the need to reverse the pulses at the input of the photonic neurons and those related to the strict control of the frequency difference between the master and slave lasers. In addition, through the selection of the widths of the integrated waveguides, the confinement factor of the optical modes is optimised, which improves the performances of the pulsed laser device 1.

Particular embodiments have just been described. Various variations and modifications will appear to a person skilled in the art.

The invention claimed is:

1. A pulsed laser device, including:
   a III-V-on-silicon type hybrid pulsed laser source, including:
   a semiconductor medium including quantum wells, made based on a III-V compound, located in an optical cavity defining a longitudinal axis, and including at least one gain section and at least one saturable absorber section where the quantum wells are coplanar;
   a photonic substrate, made based on silicon, on which the semiconductor medium rests, and in which a longitudinal waveguide is located, the longitudinal waveguide:
   being involved in defining the optical cavity, and being optically coupled to the semiconductor medium along the longitudinal axis,
   having a width $I_{L/ms}$ and a vertical spacing $d_{L/ms}$ with respect to the semiconductor medium, in a coupling area $zc_{L/ms}$ with the semiconductor medium, predefined so that the optical mode propagating in the longitudinal waveguide has a confinement factor $\Gamma_{L/ms}$ in the quantum wells of the semiconductor medium;
   at least one control optical device, including:
   at least one emitter source configured to emit at least one control optical pulse with a predefined intensity;
   at least one lateral waveguide,
   located in the photonic substrate,
   optically coupled to the saturable absorber section or to the gain section to transmit the control optical pulse, in an inclined manner with respect to the longitudinal axis to avoid an optical coupling with the optical cavity, and
   having a width as well as a vertical spacing with respect to the semiconductor medium, in a coupling area with said corresponding section, predefined so that the optical mode propagating in the lateral waveguide has a confinement factor in the quantum wells of said corresponding section higher than $\Gamma_{L/ms}$.

2. The pulsed laser device according to claim 1, wherein the lateral waveguide is configured so that the confinement factor associated with the lateral waveguide has a deviation with respect to the confinement factor $\Gamma_{L/ms}$ at least equal to 5%, and possibly 8%, and still possibly 10%.

3. The pulsed laser device according to claim 1, wherein the longitudinal waveguide has a width $I_{L/ms}$ in its coupling area $zc_{L/ms}$, and the lateral waveguide has a width in its coupling area smaller than $I_{L/ms}$.

4. The pulsed laser device according to claim 1, wherein the longitudinal waveguide has a vertical spacing $d_{L/ms}$ in its coupling area $zc_{L/ms}$ with respect to the quantum wells of the semiconductor medium, and the lateral waveguide has a vertical spacing in its coupling area with respect to the quantum wells of the semiconductor medium, where the vertical spacing $d_{L/ms}$ is larger than or equal to that of the lateral waveguide.

5. The pulsed laser device according to claim 1, wherein the longitudinal waveguide and the lateral waveguide consist of rib waveguides formed by a slab and by a rib, the lower face of the longitudinal waveguide and that of the lateral waveguide being coplanar.

6. The pulsed laser device according to claim 1, wherein the longitudinal waveguide continuously extends under the semiconductor medium; or wherein the lateral waveguide continuously extends under the corresponding section or includes at least one taper coupler.

7. The pulsed laser device according to claim 1, wherein the semiconductor medium includes at least two gain sections located on either side of the saturable absorber section.

8. The pulsed laser device according to claim 1, wherein the gain section and the saturable absorber section consist of portions physically distant from one another, or consist of areas of the same pad formed by the semiconductor medium.

9. The pulsed laser device according to claim 1, wherein said at least one control optical device is an excitation optical device, the emitter source being configured to emit at least one excitation optical pulse with a predefined intensity, and the lateral waveguide, so-called excitation lateral waveguide, is optically coupled to the saturable absorber section, the optical mode propagating in the excitation lateral waveguide then having a confinement factor $\Gamma_{lae/SA}$ in the quantum wells of the saturable absorber section higher than $\Gamma_{L/ms}$.

10. The pulsed laser device according to claim 1, wherein said at least one control optical device is an inhibition optical device, the emitter source being configured to emit at least one inhibition optical pulse with a predefined intensity, and the lateral waveguide, so-called inhibition lateral waveguide, is optically coupled to the gain section, the optical mode propagating in the inhibition lateral waveguide then having a confinement factor $\Gamma_{lai/G}$ in the quantum wells of the gain section higher than $\Gamma_{L/ms}$.

11. The pulsed laser device according to claim 9, including an excitation optical device and an inhibition optical device.

12. The pulsed laser device according to claim 11, including optical intensity attenuators arranged on the lateral waveguides, and adapted to reduce the intensity of the excitation and inhibition optical pulses.

13. A photonic artificial neural network, including a plurality of pulsed laser devices according to claim 11, wherein each pulsed laser source forms a photonic artificial neuron, the photonic artificial neurons being optically connected to each other.

14. The photonic artificial neural network according to claim 13, wherein a longitudinal waveguide of a pulsed laser device forms a lateral waveguide for exciting or inhibiting another pulsed laser device.

15. A method for using a pulsed laser device according to claim 11, including the following steps of:

directly polarising the gain section with an electric current with a predefined constant intensity so that the gain g of the semiconductor medium reaches a maximum value $g_{max}$, and applying a zero or inverse polarisation of the saturable absorber section;

emitting an excitation optical pulse by the excitation optical device, causing an emission of a laser pulse by the pulsed laser source if the gain is at least equal to an excitability value $g_{exc}$;

emitting an inhibition optical pulse by the inhibition optical device, preventing the emission of a laser pulse through a reduction of the value of the gain below the excitability value $g_{exc}$.

\* \* \* \* \*